(12) United States Patent
Wirbeleit et al.

(10) Patent No.: US 7,964,458 B2
(45) Date of Patent: Jun. 21, 2011

(54) METHOD FOR FORMING A STRAINED TRANSISTOR BY STRESS MEMORIZATION BASED ON A STRESSED IMPLANTATION MASK

(75) Inventors: Frank Wirbeleit, Dresden (DE); Roman Boschke, Dresden (DE); Martin Gerhardt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 380 days.

(21) Appl. No.: 11/746,106

(22) Filed: May 9, 2007

(65) Prior Publication Data
US 2008/0026572 A1     Jan. 31, 2008

(30) Foreign Application Priority Data
Jul. 31, 2006   (DE) .......................... 10 2006 035 646

(51) Int. Cl.
*H01L 21/8238* (2006.01)
(52) U.S. Cl. .. 438/199; 438/229; 438/231; 257/E21.476
(58) Field of Classification Search .................. 438/199, 438/218, 229, 230, 231; 257/E21.476
See application file for complete search history.

(56) References Cited

U.S. PATENT DOCUMENTS

| | | | |
|---|---|---|---|
| 2003/0151109 A1 | 8/2003 | Taniguchi et al. | 257/500 |
| 2004/0262784 A1 | 12/2004 | Doris et al. | 257/900 |
| 2005/0136583 A1 | 6/2005 | Chen et al. | 438/199 |
| 2005/0199958 A1* | 9/2005 | Chen et al. | 257/368 |
| 2006/0017138 A1 | 1/2006 | Ting | 257/632 |
| 2006/0073650 A1 | 4/2006 | Sridhar et al. | 438/199 |
| 2006/0099745 A1 | 5/2006 | Hsu et al. | 438/149 |
| 2006/0099765 A1 | 5/2006 | Yang | 438/301 |

OTHER PUBLICATIONS

Ortolland et al., "Stress Memorization Technique (SMT) Optimization for 45nm CMOS," *2006 Symposium on VLSI Technology Digest of Technical Papers*, 2006.
PCT Search Report from PCT/US2007/016579 dated Jan. 21, 2008.

\* cited by examiner

*Primary Examiner* — Jack Chen
(74) *Attorney, Agent, or Firm* — Williams, Morgan & Amerson, P.C.

(57) ABSTRACT

By using an implantation mask having a high intrinsic stress, SMT sequences may be provided in which additional lithography steps may be avoided. Consequently, a strain source may be provided without significantly contributing to the overall process complexity.

14 Claims, 8 Drawing Sheets

METHOD FOR FORMING A STRAINED TRANSISTOR BY STRESS MEMORIZATION BASED ON A STRESSED IMPLANTATION MASK

BACKGROUND OF THE INVENTION

1. Field of the Invention

Generally, the subject matter disclosed herein relates to the formation of integrated circuits, and, more particularly, to the formation of transistors having strained channel regions by using stress-inducing sources, such as stressed overlayers and the like, so as to enhance charge carrier mobility in the channel region of an MOS transistor.

2. Description of the Related Art

The fabrication of integrated circuits requires the formation of a large number of circuit elements on a given chip area according to a specified circuit layout, wherein a field effect transistor is an essential component in complex circuits comprising digital circuitry. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, renders the channel length an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. The continuous size reduction of the critical dimensions, i.e., the gate length of the transistors, necessitates the adaptation and possibly the new development of highly complex process techniques, for example, for compensating for short channel effects. It has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, wherein, depending on the magnitude and direction of the tensile strain, an increase in mobility of 50% or more may be obtained, which, in turn, may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, external stress, created by, for instance, permanent overlaying layers, spacer elements and the like, is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs.

In still a further approach, a substantially amorphized region may be formed adjacent to the gate electrode at an intermediate manufacturing stage, which may then be re-crystallized in the presence of a stressed layer formed above the transistor area. During the anneal process for re-crystallizing the lattice, the growth of the crystal will occur under the stress created by the overlayer and result in a strained crystal. After the re-crystallization, the sacrificial stress layer may be removed, wherein nevertheless a certain amount of strain may be "conserved" in the re-grown lattice portion. This effect is generally known as stress memorization. Although the exact mechanism is not yet fully understood, it is believed that a certain degree of strain is generated in the overlying polysilicon gate electrode, which may still be present even after the removal of the stress-inducing layer. Since the gate structure may maintain a certain amount of strain after the removal of the initial stress layer, the corresponding strain may also be transferred to as the re-grown crystal portion, thereby also maintaining a certain fraction of the initial strain.

The stress memorization technique may be advantageously combined with other "permanent" strain-inducing sources, such as stressed contact etch stop layers, strained embedded semiconductor material and the like, in order to increase the overall efficiency of the strain-inducing mechanism. However, the transistor type specific patterning of the additional sacrificial stress layer may require a further lithography process in conventional strategies, thereby contributing even more to the overall production costs.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to a technique for forming transistor elements having a strained channel region by using a stress memorization approach, wherein the number of lithography steps may be reduced, thereby also reducing the overall production costs of highly advanced integrated circuits. The number of lithography steps in the stress memorization technique may be reduced by forming an implantation mask so as to comprise a high intrinsic stress, which may be efficiently transferred in a respective transistor element covered by the implantation mask during an anneal process in the presence of the implantation mask. Consequently, since implantation masks may be required at several manufacturing stages, which are conventionally provided as resist masks, the respective lithography step may be efficiently used for patterning a hard mask implantation layer having the desired stress characteristics. Hence, the stress memorization technique may be effectively combined with other strain-inducing mechanisms, while not requiring additional photolithography steps.

According to one illustrative embodiment disclosed herein, a method comprises covering a first region receiving a dopant species of a first conductivity type in a semiconductor layer adjacent to a first gate electrode by a first implantation mask which comprises a specified first intrinsic stress. The method further comprises implanting a dopant species of a second conductivity type into a second region adjacent to a second gate electrode, wherein the second region is not covered by the first implantation mask. Finally, the first and second regions are annealed in the presence of a stressed portion of the first implantation mask.

According to another illustrative embodiment disclosed herein, a method comprises introducing a first dopant species into a first transistor while covering a second transistor by a first implantation mask, which comprises a first intrinsic stress. Moreover, the method comprises annealing the first and second transistors in the presence of at least a stressed portion of the first implantation mask.

According to yet another illustrative embodiment disclosed herein, a method comprises forming a first implantation mask to expose a first transistor and to cover a second transistor, wherein the first implantation mask comprises a first type of intrinsic stress. Furthermore, a first dopant species is introduced into the first transistor on the basis of the first implantation mask. The second transistor is then annealed in the presence of at least a stressed portion of the first implantation mask. Additionally, a second implantation mask is formed to cover the first transistor and expose the second transistor, wherein the second implantation mask comprises a second type of intrinsic stress. Moreover, a second dopant species is introduced into the second transistor on the basis of the second implantation mask and the first transistor is annealed in the presence of at least a stressed portion of the second implantation mask.

BRIEF DESCRIPTION OF THE DRAWINGS

The disclosure may be understood by reference to the following description taken in conjunction with the accompanying drawings, in which like reference numerals identify like elements, and in which.

Figure 1A:
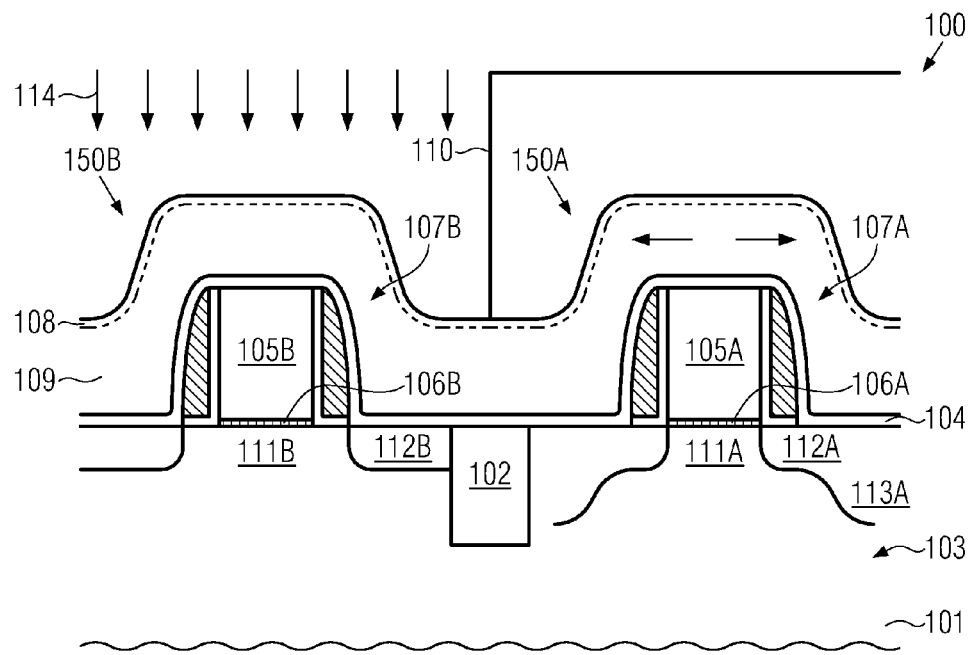
FIGS. 1$a$-1$e$ schematically illustrate cross-sectional views of two different transistors during various manufacturing stages in defining drain and source regions on the basis of a stressed implantation mask according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides a technique for efficiently using the stress memorization technique (SMT) during the manufacturing process for forming advanced transistor elements having a strained channel region. As is well known, during various manufacturing stages, dopant species have to be introduced into respective semiconductor areas to appropriately adjust the conductivity of the respective areas. For example, the drain and source regions of field effect transistors may typically be formed on the basis of an implantation process, wherein transistors of different conductivity types require different dopant species, which are selectively introduced by providing an implantation mask. According to the subject matter disclosed herein, in one or more of the respective implantation processes, the corresponding implantation mask may be provided, at least partially, in the form of a highly stressed material, which may then be used as a stress-inducing source during a subsequent anneal process, in which damaged or intentionally amorphized portions of the respective semiconductor areas are re-grown so as to obtain a respective strain created by the overlying stressed implantation mask. Consequently, an efficient strain-inducing mechanism may be provided without requiring additional expensive photolithography steps so that transistor performance may be increased while only insignificantly contributing to process complexity compared to conventional approaches. In sophisticated applications, typically a plurality of different strain-inducing mechanisms may be provided, such as stressed permanent dielectric layers, such as contact etch stop layers, stressed spacer elements, strained semiconductor material in the drain and source regions and/or respective semiconductor alloys in and below the channel region, which may require additional highly complex process steps, thereby significantly raising the overall production costs. Since the stress memorization technique provides an efficient means for creating and maintaining strain in a transistor element on the basis of an intermediate or sacrificial material layer, the subject matter disclosed herein enables a further significant enhancement of the previously described stress-inducing mechanisms substantially without adding to further production costs.

In some illustrative embodiments disclosed herein, the process steps for forming a respective stressed implantation mask may be efficiently combined with other process steps, such as the removal of spacer elements, the formation of spacer elements and the like, so as to even further reduce the degree of additional process complexity compared to conventional strategies without using stress memorization techniques or performing the same on the basis of additional lithography steps. Furthermore, in combination with sophisticated anneal techniques, in which extremely short anneal times may be achieved on the basis of laser radiation or flashlight radiation, a substantial lattice damage may be intentionally created several times during the manufacturing process in order to repeatedly allow a strained re-growth of the damaged semiconductor material, wherein, due to the extremely short anneal times, a significant diffusion of dopants may be substantially suppressed. Consequently, the principles of the present disclosure may be readily applied to different transistor types requiring differently stressed implantation masks, without necessitating further lithography steps so that an efficient strain engineering for different transistor types, such as P-channel transistors and N-channel transistors, may be accomplished. Additionally, the repeated anneal sequences may even further enhance the degree of dopant activation in previously doped semiconductor areas. In other cases, an undesired repeated dopant activation or annealing may be reduced or avoided by appropriately selecting the optical characteristics of the stressed implantation mask in order to significantly reduce the energy deposition in the covered semiconductor areas. Thus, it should be appreciated that, although in the embodiments described in this application the strain-inducing mechanism based on a sacrificial layer may be described as the single source for creating strain in the respective channel regions, the principles of the present disclosure may be advantageously combined with other stress- and strain-inducing mechanisms.

FIG. 1a schematically illustrates a semiconductor device 100 comprising a substrate 101, which may have formed thereon a semiconductor layer 103, such as a silicon-based semiconductor layer, which may be understood as a semiconductor material comprising a significant amount of silicon, such as 50 atomic percent or more, while other atomic species may also be present, such as germanium, carbon, or any other semiconductor alloys, dopants and the like. It should be appreciated that, in some illustrative embodiments, the semiconductor layer 103 may represent an upper portion of the substrate 101 in order to provide a "bulk" configuration, while in other embodiments a buried insulating layer (not shown) may be provided on which the semiconductor layer 103 may be formed so as to provide a silicon-on-insulator (SOI) configuration. In and above the semiconductor layer 103, a first transistor element 150A and a second transistor element 150B may be provided, which may be separated, for instance by an isolation structure 102, such as a trench isolation or any other appropriate isolation configuration. In some illustrative embodiments, the transistors 150A, 150B may represent transistors of different conductivity types, such as a P-channel transistor and an N-channel transistor, while in other cases the transistors 150A, 150B may represent transistor elements belonging to different functional blocks, such as a logic block, a memory area and the like, wherein the transistors 150A, 150B may represent the same or a different conductivity type. In this case, the transistors 150A, 150B may be provided at different chip areas, depending on the circuit layout. The transistors 150A, 150B may comprise respective gate electrodes 105A, 105B at sidewalls of which may be formed respective spacer structures 107A, 107B. Furthermore, the respective gate electrodes 105A, 105B are separated from respective channel regions 111A, 111B by gate insulation layers 106A, 106B. Moreover, respective extension regions 112A, 112B may be defined adjacent to the respective channel regions 111A, 111B. In this manufacturing stage, the first transistor 150A may already have formed therein deep drain and source regions 113A. It should be appreciated that, in one illustrative embodiment, the respective drain and source regions 113A, as well as the extension region 112A, may still be in a highly damaged or amorphized state due to any preceding implantation processes. Similarly, in this manufacturing stage, the extension region 112B, as well as an underlying portion of the semiconductor layer 103 of the second transistor 150B, may still be in a highly damaged or amorphized state, depending on the previous process history. In other illustrative embodiments, as will be described later on in more detail, the semiconductor layer 103 in one or both of the transistors 150A, 150B may be in a substantially crystalline state.

Moreover, a liner material 104 may be formed above the first and second transistors 150A, 150B, wherein the liner 104 may act as an etch stop layer for patterning a mask layer 109 formed above the etch stop layer 104. The mask layer 109 may be comprised of any appropriate material, such as silicon dioxide, silicon nitride and the like, which may be formed so as to include a high intrinsic stress, such as tensile or compressive stress, with a magnitude of up to 1.8 GPa (Giga Pascal) or even higher. For example, if the first transistor 150A represents an N-channel transistor whose channel region 111A is to receive a tensile strain, the mask layer 109 may be provided with high intrinsic tensile stress, which may be efficiently transferred into the channel region 111A and may be at least partially maintained therein even after the removal of the mask layer 109 in a later manufacturing stage. Similarly, if the transistor 150A represents a P-channel transistor, the mask layer 109 may be provided with high compressive stress which may then be transferred into the channel region 111A during a respective anneal process, as will be described later on. In one illustrative embodiment, the mask layer 109 may have a surface layer 108 of increased adhesion with respect to a resist material used to form a corresponding resist mask 110, which covers the first transistor 150A while exposing the second transistor 150B, i.e., the corresponding portion of the mask layer 109 and the adhesion surface layer 108 formed above the second transistor 150B. For instance, the surface layer 108 may comprise silicon dioxide when the mask layer 109 is provided in the form of highly stressed silicon nitride. In other cases, the surface layer 108 may represent an oxygen plasma treated surface portion of the mask layer 109.

A typical process flow for forming the semiconductor device 100 as shown in FIG. 1a may comprise the following processes. After providing the substrate 101 having formed thereon the semiconductor layer 103, appropriate manufacturing sequences may be performed in order to define the respective transistor regions for the first and second transistors 150A, 150B. For example, respective isolation structures, such as the isolation structure 102, may be formed on the basis of well-established techniques. To these ends, photolithography, etch, deposition and planarization techniques may be used. Thereafter, any implantation processes may be performed to establish the required dopant profile for the first and second transistors 150A, 150B, for instance with respect to channel doping and the like.

Thereafter, the respective gate electrodes 105A, 105B and the gate insulation layers 106A, 106B may be formed on the basis of well-established process strategies (for convenience the respective letters indicating the association with the first or the second transistor 150A, 150B may be omitted when appropriate). In some illustrative embodiments, the gate electrodes 105A, 105B may be formed from polysilicon, while the gate insulation layers 106A, 106B may comprise silicon dioxide, silicon nitride, silicon oxynitride or any other appropriate dielectric material.

Thereafter, appropriate implantation processes may be performed, for instance a preamorphization implantation for substantially amorphizing semiconductor areas adjacent to the respective gate electrodes 105A, 105B, and thereafter respective halo implantations, if required, as well as an implantation sequence for the extension regions 112A, 112B, may be performed. For this purpose, appropriate offset spacers (not shown) may be formed at the sidewalls of the respective gate electrodes 105A, 105B. It should be appreciated that the extension regions 112A may comprise a dopant of a first conductivity type and the extension regions 112B may be comprised of a dopant of a second different conductivity type, when the transistors 150A, 150B represent transistors of different conductivity types, such as an N-channel transistor and a P-channel transistor, respectively. In this case, respective implantation masks may be provided so as to individually form the respective extension regions 112B, 112A.

Thereafter, the sidewall spacers 107A, 107B may be formed on the basis of well-established techniques, which may, for instance, include the deposition of a liner material followed by the deposition of an appropriate spacer material, such as silicon nitride, silicon dioxide and the like. The corresponding spacer material may then be anisotropically etched to provide the spacers 107A, 107B.

Thereafter, the deep drain and source regions 113A may be formed by an appropriately designed implantation process, wherein the second transistor 150B may be masked by a respective resist mask (not shown). Next, the liner 104 may be formed on the basis of well-established techniques, such as plasma enhanced chemical vapor deposition (PECVD) and the like. Thereafter, the mask layer 109 may be formed, for instance by PECVD, wherein respective process parameters may be selected such that a desired high intrinsic stress may be obtained. As is well known, silicon nitride may be formed with high intrinsic compressive or tensile stress, wherein the type and the magnitude of stress may be readily adjusted on the basis of process parameters, such as deposition temperature, pressure, ion bombardment during the deposition process and the like. In other cases, silicon dioxide may be formed with respective intrinsic stress, for instance on the basis of PECVD, wherein respective process parameters may also be controlled for obtaining the desired type and magnitude of intrinsic stress.

Thereafter, the surface layer 108 may be formed, for instance by a plasma treatment of the previously deposited mask layer 109, or by providing a separate surface layer that provides increased adhesion for a resist material to be deposited above the mask layer 109. For example, if the mask layer 109 is provided as a silicon nitride material, the surface layer 108 may be provided in the form of a silicon dioxide layer which may exhibit an increased adhesion to a plurality of well known resist materials. In other cases when the mask layer 109 itself may have sufficient adhesion to the resist material, the respective surface layer 108 may be omitted. In still other illustrative embodiments, a planarization layer (not shown) may be provided so as to substantially planarize the surface topography of the device 100 prior to depositing resist material, when the pronounced surface topography of the mask layer 109 may negatively affect the subsequent photolithography process. Thereafter, any appropriate resist material may be deposited and may be exposed by a well-established photolithography process so as to provide, after any post-exposure treatments, the resist mask 110 as shown in FIG. 1a. Based on the resist mask 110, the device 100 may be exposed to an etch ambient 114 designed to remove an exposed portion of the mask layer 109 and the surface layer 108, if provided, in order to expose the second transistor 150B for a subsequent implantation process, during which at least the remaining mask layer 109 may act as an implantation mask.

Figure 1B:
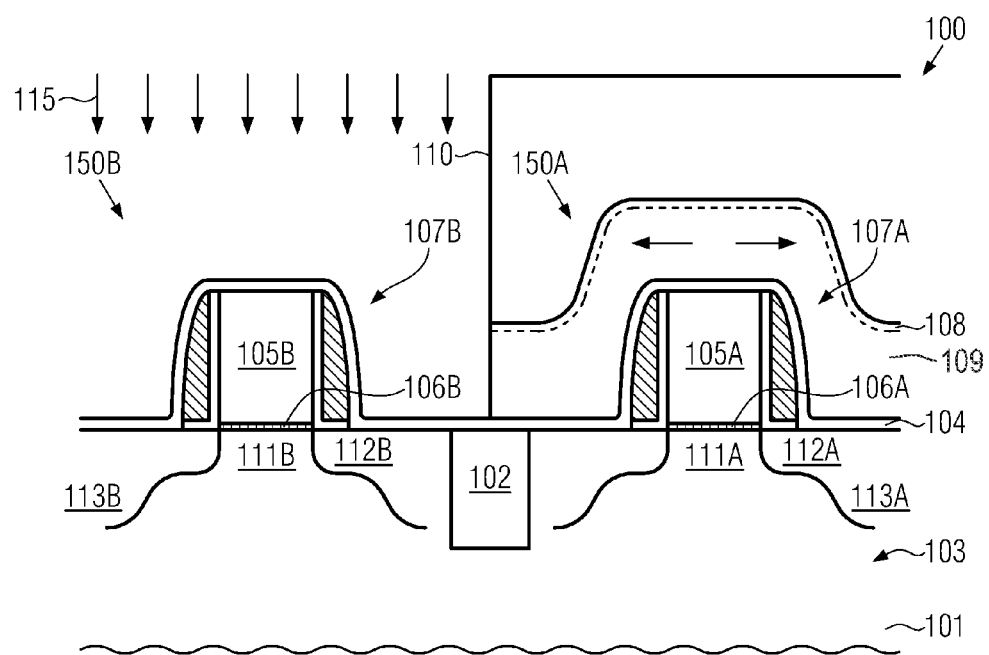

FIG. 1b schematically illustrates the semiconductor device 100 after removal of the exposed portions of the layers 109 and 108 by the etch process 114. In some illustrative embodiments, the liner 104 may also be removed from the second transistor 150B during the etch process 114, while in other illustrative embodiments the liner 104 may be maintained when the respective additional masking effects during a subsequent implantation process 115 may not adversely affect the resulting lateral dopant profile of the respective deep drain and source regions 113B created by the implantation process 115. In the illustrative embodiment shown in FIG. 1b, the implantation process 115 may be performed on the basis of the resist mask 110 and the patterned mask layer 109, which commonly provide an efficient implantation mask having a portion of high intrinsic stress, i.e., the patterned mask layer 109. Maintaining the resist mask 110 during the ion bombardment of the process 115 may significantly reduce any relaxation effect which may otherwise be created in the mask layer 109 when acting as the sole implantation mask for the process 115. In other illustrative embodiments, the resist mask 110 may be removed prior to the implantation process 115 when the thickness of the mask layer 109 is sufficient to efficiently stop the ion bombardment of the process 115 and also maintain a sufficiently thick residual layer portion having a desired high intrinsic stress.

Figure 1C:
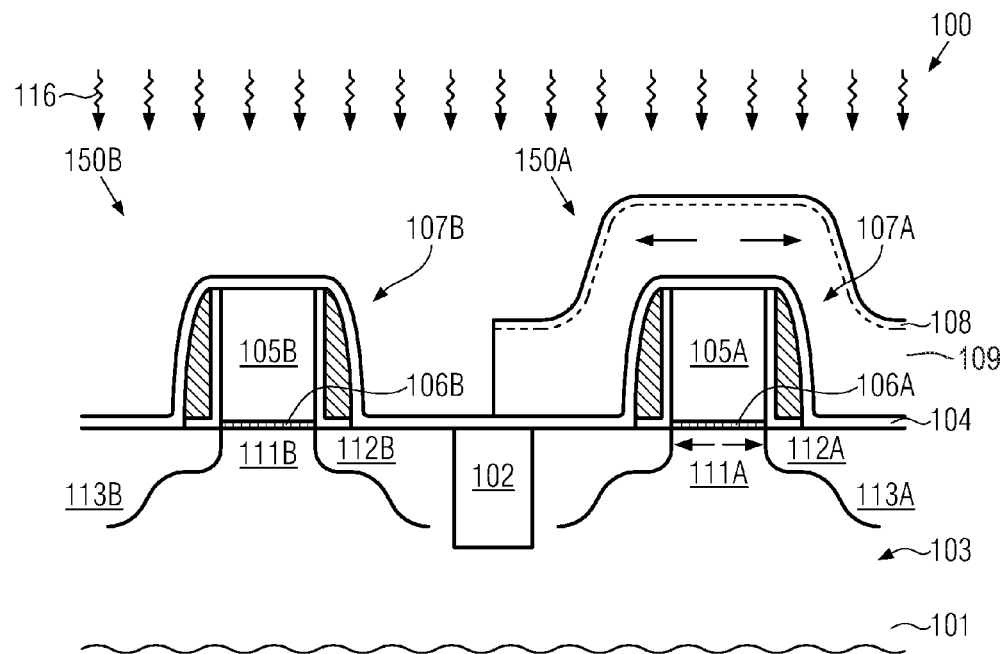

FIG. 1c schematically illustrates the semiconductor device 100 after the removal of the resist mask 110. Moreover, the device 100 is subjected to an anneal process 116, which may be designed to enable an efficient activation of the dopant species in the respective drain and source regions 113A, 113B, possibly in combination with the activation of the dopants in the respective extension regions 112A, 112B. As previously explained, due to the preceding implantation process for forming the drain and source regions 113A and possibly due to a previously performed amorphization implantation, a high degree of lattice damage may have been created. Consequently, during the anneal process 116, the corresponding damaged lattice portions are re-grown, wherein, due to the presence of the highly stressed mask layer 109 above the first transistor 150A, the respective re-crystallization process results in a strained lattice portion of the drain and source region 113A, which also induces a respective strain in the adjacent channel region 111A. Although not quite fully understood, it is assumed that a respective strain is also created in the gate electrode 105A, which may, due to the specific polycrystalline configuration, be maintained to a certain amount even after the removal of the mask layer 109. In some illustrative embodiments, the anneal process 116 may comprise a laser-based or flash-based anneal process during which extremely short exposure times may be achieved, which may result in an efficient re-crystallization process and activation state, whereas an undue diffusion of the dopant species within the respective extension regions 112A, 112B and the drain and source regions 113A, 113B may be reduced or suppressed. In other illustrative embodiments, the anneal process 116 may comprise a "low temperature" anneal sequence, which may be performed with temperatures in the range of 600-800° C., thereby also suppressing undue dopant diffusion, while efficiently re-crystallizing damaged lattice portions. Additionally a further laser-based or flash-based anneal step may be performed for providing an increased degree of dopant activation.

Figure 1D:
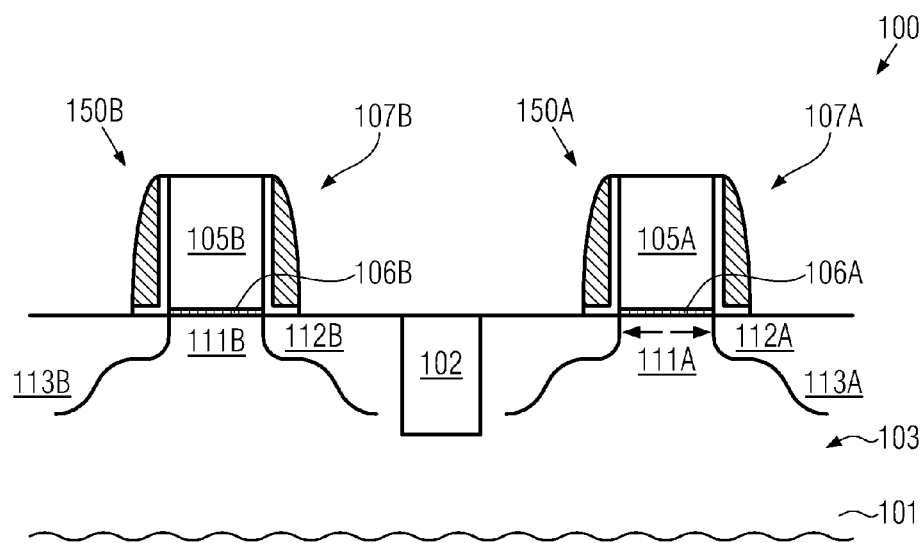

FIG. 1d schematically illustrates the semiconductor device 100 after the removal of the mask layer 109 from the first transistor 150A. For example, an appropriately designed selective etch process may be performed, wherein the liner 104 may provide a desired high etch selectivity. For example, a wet chemical etch process based on well-established recipes may be performed for removing the mask layer 109. Subsequently, the liner 104 may be removed, for instance on the basis of a suitable etch chemistry. Thus, even after the removal of the mask layer 109, a significant amount of strain may remain in the drain and source regions 113A and the extension regions 112A, thereby also providing a respective strain in the channel region 111A. Thereafter, further processing may be continued on the basis of well-established manufacturing strategies, which may include the formation of metal silicide regions in the respective source and drain regions 113A, 113B and the gate electrodes 105A, 105B.

Thereafter, further stressed layers may be formed above the first and second transistors 150A, 150B in order to provide a further strain-inducing source. For example, a stressed layer having substantially the same intrinsic stress as the mask layer 109 may be formed above the first transistor 150A, thereby even further increasing the respective strain in the channel region 111A. Similarly, a respective stressed layer may be formed above the second transistor 150B having a desired type and magnitude of intrinsic stress in order to enhance the performance of the second transistor 150B.

It should also be appreciated that other strain-inducing mechanisms may also be provided in combination with the "memorized" strain obtained on the basis of the mask layer 109. For instance, in one or both of the transistors 150A, 150B, a strained semiconductor material may be provided, for instance at an early manufacturing stage, in order to even further enhance the respective strain. For example, it may be assumed that the second transistor 150B may have received a corresponding strained semiconductor material in the drain and source region 113B, for instance by forming a recess adjacent to the gate electrode 105B and refilling the recess with a strained silicon/germanium material, which may then provide a significant compressive strain in the channel region 111B. Thereafter, further processing may be continued as is described with reference to FIGS. 1a-1d in order to create a respective tensile strain in the channel region 111A on the basis of the stress memorization technique described above. Also in this case, respective stressed overlayers, such as contact etch stop layers, may be individually formed above the first and second transistors 150A, 150B.

Figure 1E:
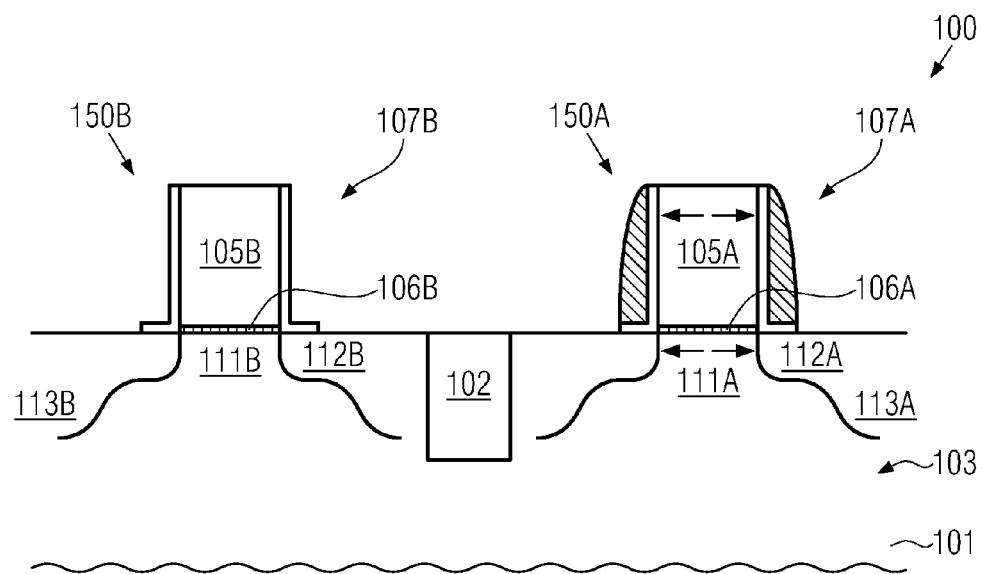

FIG. 1e schematically illustrates the semiconductor device 100 according to another illustrative embodiment wherein, during the patterning of the mask layer 109, the exposed portion of the liner 104 (FIG. 1b) may also be removed. In this case, at least the spacer 107B may also be removed during the removal of the mask layer 109 in a common etch process when these components are comprised of substantially the same material. In other cases, the liner 104 formed above the second transistor 150B may be removed commonly with the surface layer 108 and subsequently the spacer 107B and the mask layer 109 may be removed in a common etch process. The removal of the spacer 107B may be advantageous when the spacers 107A, 107B may have been formed from a stressed spacer material, which may comprise substantially the same type of stress as the mask layer 109. Consequently, by removing at least the spacer 107B, the strain-inducing mechanism of an overlying stress layer, such as a contact etch stop layer still to be formed, may have an increased efficiency, since the respective stress material may be positioned closer to the gate electrode and the respective channel region 111B. In other cases, both spacer elements 107A, 107B may be removed from the mask layer 109 by using an etch chemistry having a moderately high selectivity with respect to a liner material used for forming the spacers 107A, 107B while efficiently removing material of the mask layer 109 and the liner 104. In this way, the stress-inducing mechanism of a subsequently formed stressed overlayer may be significantly enhanced, substantially without contributing to process complexity.

In some embodiments, the above-described process flow may also be used for forming the drain and source regions 113A of the transistor 150A in order to provide a respective implantation mask having a stressed portion above the first transistor 150A. During a respective anneal process, the regions 113A may be activated while the drain and source areas of the second transistor 150B, which do not yet include the regions 113B, may be re-grown with a corresponding strain. In this case, prior to or after removing the respective stressed implantation mask from the second transistor, a further amorphization implantation may be performed to create a desired degree of lattice damage at least in the first transistor prior to performing the above-described stress memorization technique in the first transistor 150A. During the removal of the stressed implantation mask or the stressed portion thereof, the spacer 107A in the first transistor 150A may also be removed.

With reference to FIGS. 2a-2e, further illustrative embodiments will now be described in which a respective stressed implantation mask may be provided at an earlier manufacturing stage compared to the sequence as previously described with reference to FIGS. 1a-1e.

Figure 2A:
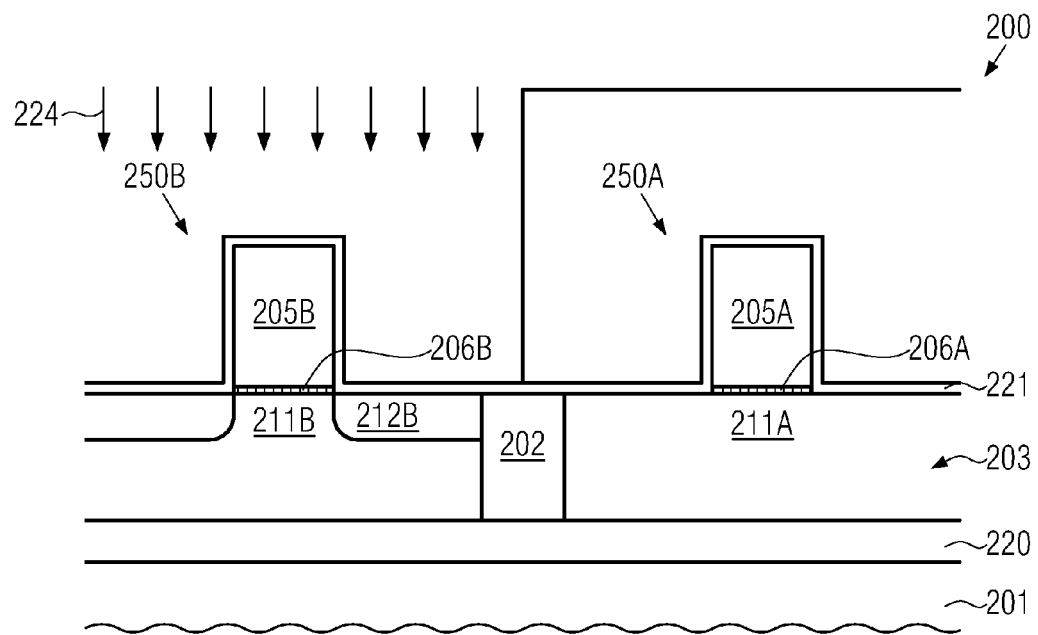
FIGS. 2$a$-2$e$ schematically illustrate cross-sectional views of a semiconductor device during various manufacturing stages for defining extension regions and drain and source regions, wherein the implantation sequence for the extension regions is performed on the basis of a stressed implantation mask according to further illustrative embodiments disclosed herein.

In FIG. 2a, a semiconductor device 200 comprises a substrate 201, above which is formed a semiconductor layer 203. Furthermore, in the embodiment shown, a buried insulating layer 220 may be located between the substrate 201 and the semiconductor layer 203. Consequently, an SOI configuration is established by the substrate 201 in combination with the layers 220 and 203. It should be appreciated that the buried insulating layer 220 may be omitted in other illustrative embodiments when a bulk configuration is considered. Furthermore, a first transistor 250A and a second transistor 250B may be formed above and in the semiconductor layer 203, wherein a corresponding isolation structure 202 may separate the transistors 250A, 250B. Furthermore, at this manufacturing stage, respective gate electrodes 205A, 205B are provided and are separated from respective channel regions 211A, 211B by gate insulation layers 206A, 206B. With respect to the components described so far, the same criteria apply as previously explained with reference to the semiconductor device 100. Hence, a further description of these components may be omitted here. Furthermore, an implantation mask 223, for instance a resist mask, may be provided so as to expose the second transistor 250B while covering the first transistor 250A. Furthermore, an offset spacer layer 221 may be formed so as to cover at least sidewalls of the respective gate electrodes 205B, 205A.

The semiconductor device 200 as shown in FIG. 2a may be formed on the basis of similar processes as previously described with reference to the corresponding components of the device 100. It should be appreciated that the offset spacer layer 221 may be formed on the basis of any appropriate technique in order to provide a desired thickness in accordance with process requirements. For instance, the offset spacer layer 221 may be deposited by appropriate techniques, such as chemical vapor deposition (CVD), or may be formed by oxidation and the like. The implantation mask 223 may be formed on the basis of well-established photolithography techniques so as to expose the second transistor 250B to an implantation process 224 for forming respective extension regions 212B in the exposed transistor 250B. It should be appreciated that in some illustrative embodiments one or both transistors 250A, 250B may have experienced a corresponding amorphization implantation prior to the process 224. Hence, at least in the second transistor 250B, a significant portion of the semiconductor layer 203 may have substantial lattice damage or may be substantially amorphized.

Figure 2B:
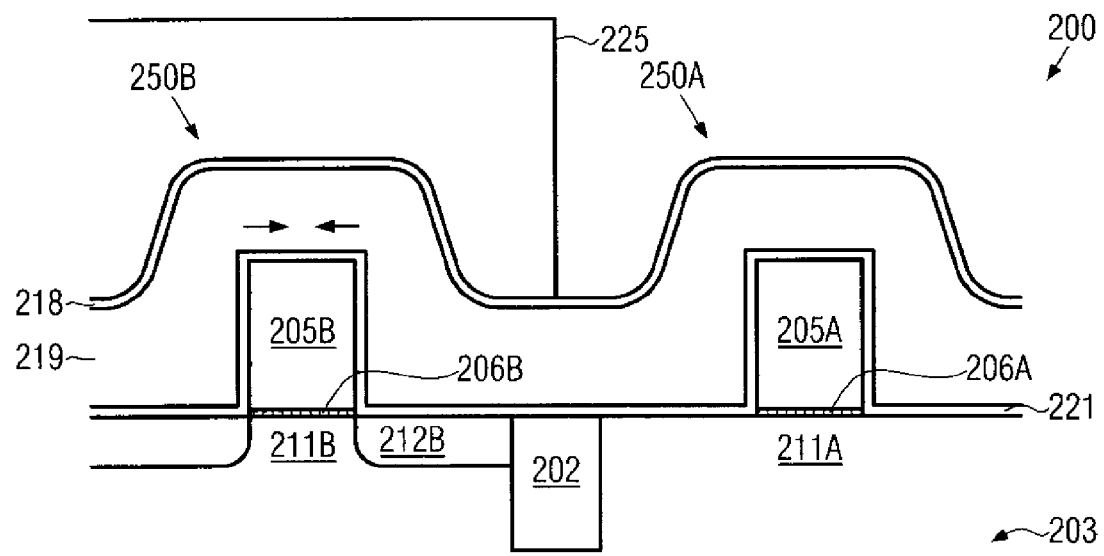

FIG. 2b schematically illustrates the semiconductor device 200 in a further advanced manufacturing stage. A mask layer 219 having a high intrinsic stress, which may be appropriate for enhancing the performance of the second transistor 250B, may be formed above the first and second transistors 250A, 250B. Furthermore, if required, an optional surface layer 218 may be formed on the layer 219 in order to enhance the adhesion for a resist material of a resist mask 225 that is formed above the second transistor 250B while exposing the first transistor 250A, that is, the respective portion of the mask layer 219 formed thereabove.

Regarding a manufacturing process for forming the layers 219, 218 and the resist mask 225, substantially the same criteria apply as previously described with respect to the components 109, 108 and 110 of the device 100 as shown in FIG. 1a. For example, when the second transistor 250B represents a P-channel transistor, the mask layer 219 may be provided with high compressive stress in order to obtain a respective strain in the channel region 211B. Thereafter, the layers 219 and 218 may be removed from the first transistor 250A on the basis of any appropriate etch technique, using the resist mask 225 as an etch mask. As previously explained, if highly sophisticated lithography techniques are required, due to highly scaled transistor devices, the resist mask 225 may be formed on the basis of a substantially planarized surface topography, which may be obtained on the basis of additional sacrificial material, such as polymer material, which may also act as an anti-reflective coating (ARC), if required.

Figure 2C:
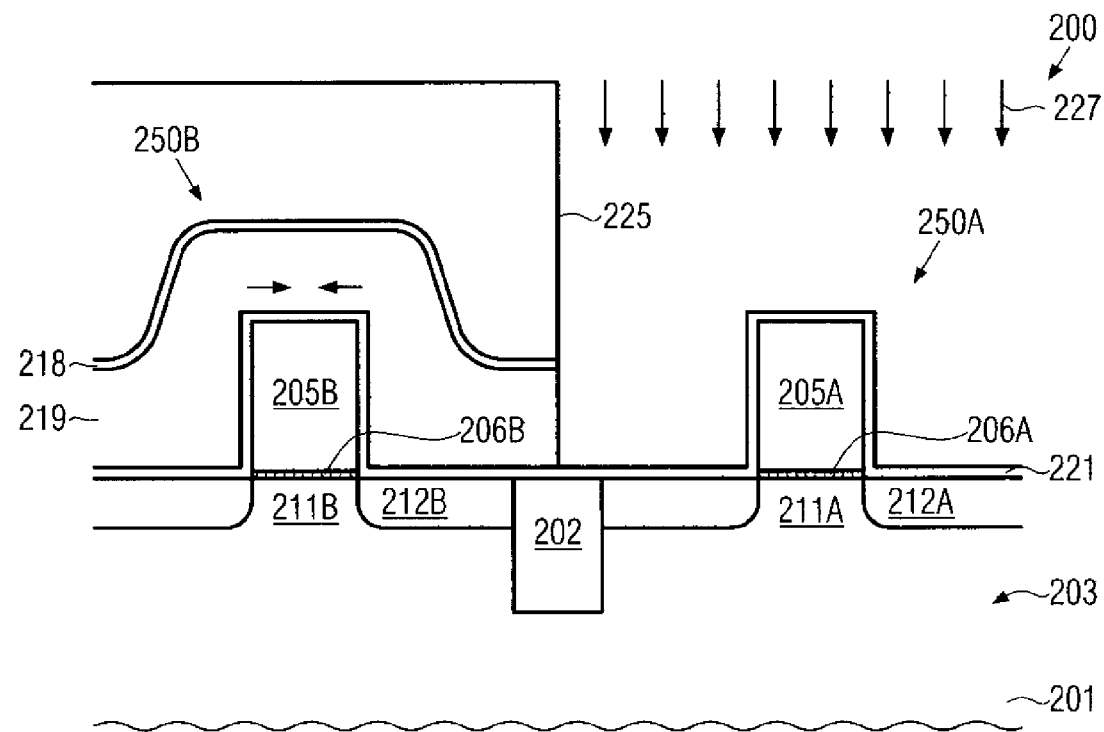

FIG. 2c schematically illustrates the semiconductor device 200 after the removal of exposed portions of the mask layer 219 and the surface layer 218, if provided, and during a further implantation process 227 for defining respective extension regions 212A in the first transistor 250A, in which the remaining mask layer 219 and the resist mask 225 may act as an implantation mask having the patterned mask layer 219 as a highly stressed portion thereof. Thereafter, the resist mask 225 may be removed.

Figure 2D:
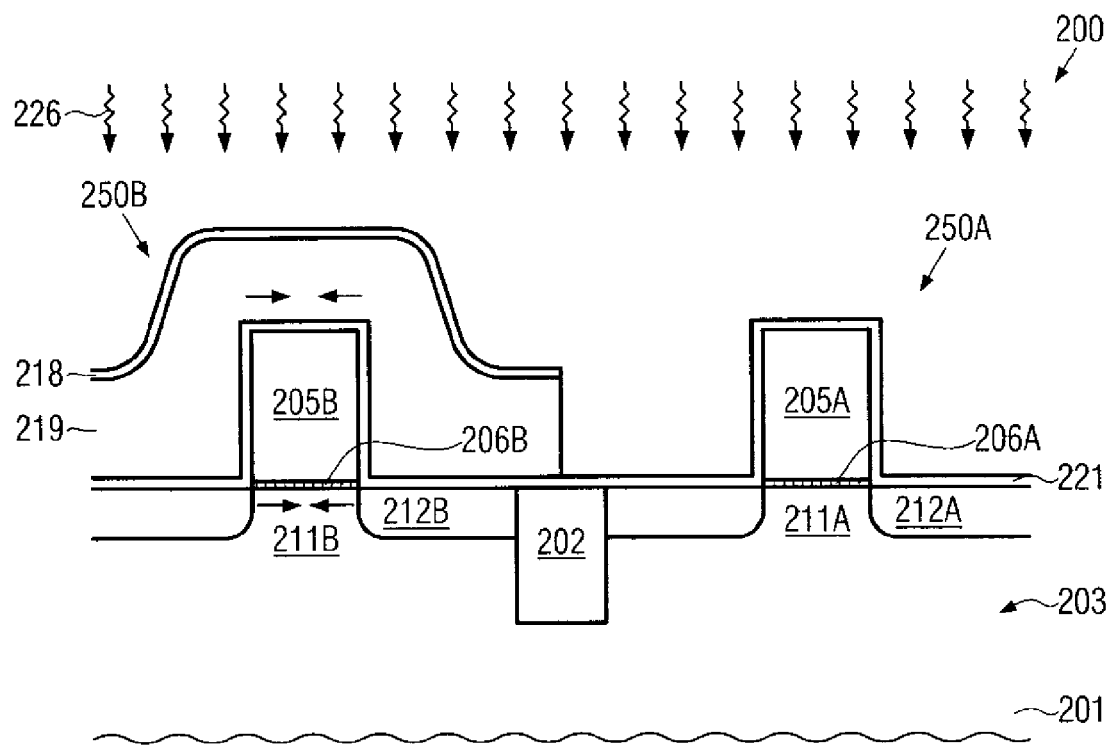

FIG. 2d schematically illustrates the device 200 during an anneal process 226 in order to re-crystallize the damaged or amorphized portions of the transistor 250B in the presence of the stressed mask layer 219. Consequently, the respective crystalline material may be re-grown with a specific strain, which may also be efficiently transferred into the channel region 211B, as is previously explained. Furthermore, during the anneal process 226, the respective dopant species in the first and second transistors 250A, 250B may be efficiently activated, wherein, in some illustrative embodiments, advanced techniques such as laser-based or flash-based processes may be used in order to reduce diffusion of the respective dopant species. Thereafter, the mask layer 219 may be removed, while a significant amount of stress or strain is still conserved in the gate electrode 205B, as is previously explained. Thereafter, the further manufacturing process may be continued by forming respective deep drain and source regions according to a conventional strategy, when an additional stress-inducing mechanism may not be required in the device 200, except for other mechanisms, such as stressed overlayers and the like, as is previously described. In other illustrative embodiments, the manufacturing process may be continued as is previously described with reference to FIGS. 1a-1d. That is, during formation of deep drain and source regions in the first transistor 250A, a stressed implantation mask may be used in order to also apply the stress memorization technique to the first transistor 250A, however in a later manufacturing stage, as is shown in FIG. 2e.

Figure 2E:
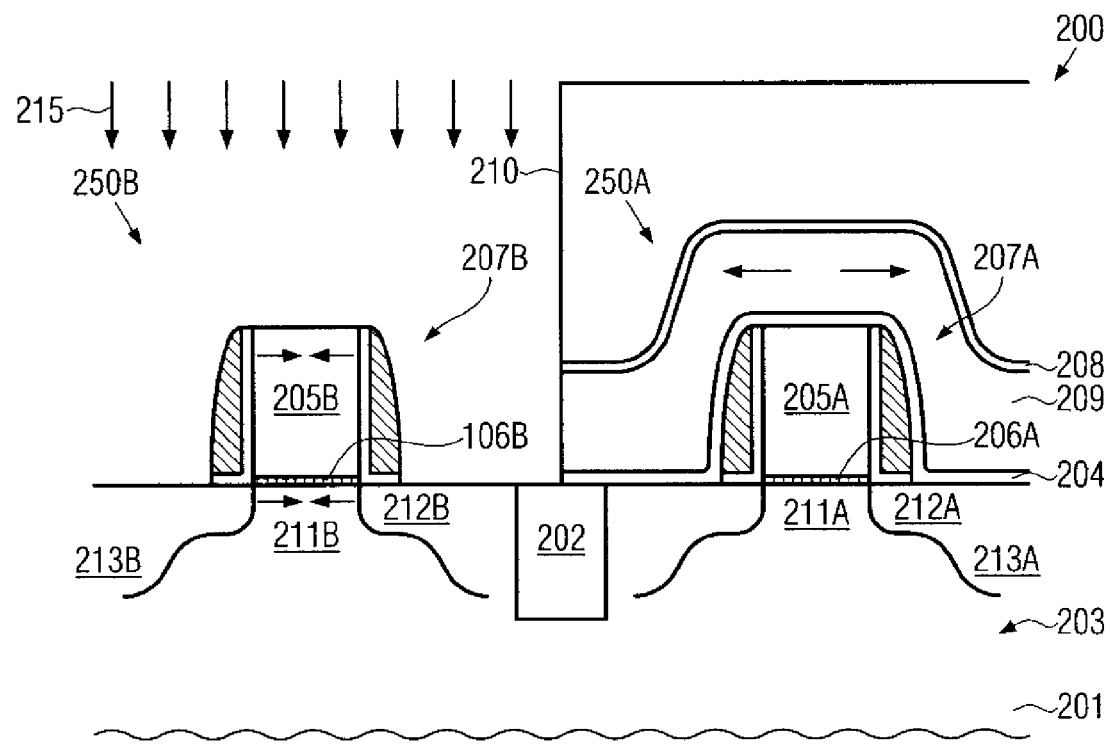

FIG. 2e schematically illustrates the device 200 according to a corresponding embodiment. Here, a respective stressed mask layer 209, possibly in combination with an appropriately designed surface layer 208, may be formed above the first transistor 250A to act, possibly in combination with a respective resist mask 210, as an implantation mask for an implantation process 215 for forming respective deep drain and source regions 213B in the second transistor 250B. The corresponding deep drain and source regions 213A in the first transistor 250A may have been formed at an earlier manufacturing stage on the basis of a conventional masking regime. It should be appreciated that the ion bombardment 215 may reduce the stress conserved in the gate electrode 205B, wherein, however, a significant amount of residual strain may still be maintained in order to provide a respective strain in the channel region 211B. Thereafter, the resist mask 210 may be removed and the device 200 may be annealed, thereby creating a respective strain in the channel region 211A, as is also previously described with reference to the device 100.

With reference to FIGS. 3*a*-3*f*, further illustrative embodiments will now be described in more detail in which the approach of a stressed implantation mask may be advantageously combined with the formation of sidewall spacers for defining the lateral dopant profile in respective transistor elements.

Figure 3A:
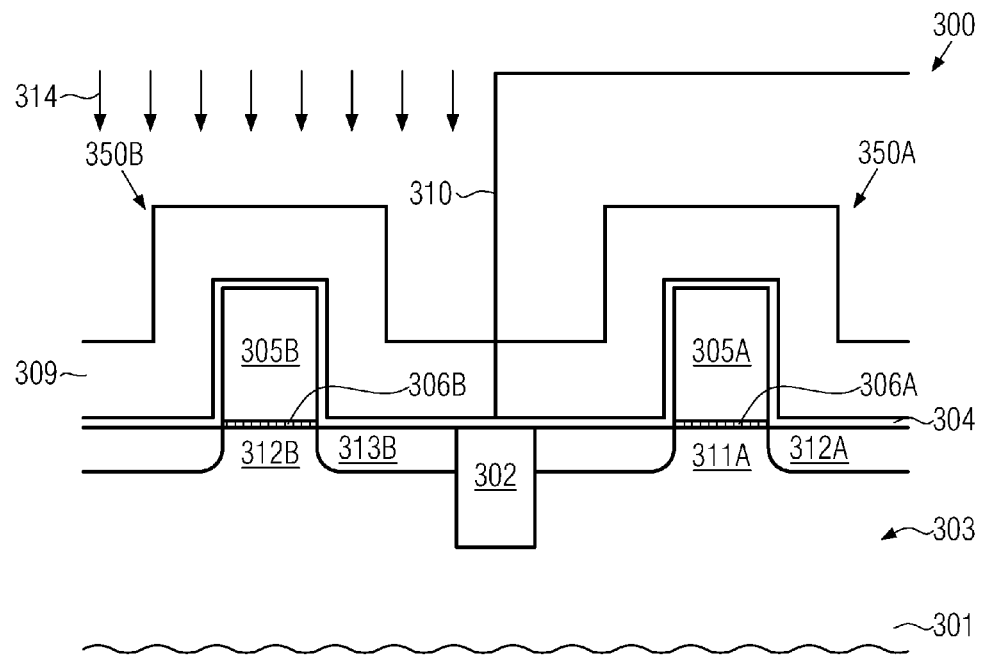
FIGS. 3$a$-3$f$ schematically illustrate a semiconductor device during various manufacturing stages in defining drain and source regions on the basis of a stressed implantation mask, wherein the respective implantation mask and sidewall spacers may be formed in a common process according to yet other illustrative embodiments disclosed herein.

FIG. 3*a* schematically illustrates a semiconductor device 300 comprising a substrate 301 above which is formed a semiconductor layer 303. Furthermore, a first transistor 350A and a second transistor 350B are formed in and on the semiconductor layer 303. In this manufacturing stage, the respective transistors 350A, 350B may comprise respective gate electrodes 305A, 305B formed on gate insulation layers 306A, 306B, which separate the respective gate electrodes 305A, 305B from corresponding channel regions 311A, 311B. Furthermore, extension regions 312A, 312B may be formed adjacent to the respective channel regions 311A, 311B. With respect to the components described so far, the same criteria apply as previously explained with reference to the devices 100 and 200. Hence, a detailed description of these components and any processes for manufacturing the same will be omitted. Moreover, a liner 304 may be formed so as to enclose the first and second transistors 350A, 350B, wherein, in one illustrative embodiment, a thickness of the liner 304 may substantially correspond to a desired offset required for defining the extension regions 312A, 312B. In other illustrative embodiments, the extension regions 312A, 312B may be formed on the basis of a separate offset spacer (not shown) and the liner 304 may have any appropriate thickness as required for the further processing. In one illustrative embodiment, a mask layer 309 may be formed above the first and second transistors 350A, 350B, wherein the mask layer 309 may comprise a high intrinsic stress as required for creating a specified strain in one of the transistors 350A, 350B. Furthermore, the mask layer 309 may be provided with an appropriate thickness so as to obtain a desired spacer width for respective spacer elements formed of the mask layer 309 in one of the transistors 350A, 350B. To this end, an etch mask 310, for instance comprised of a resist material, may be provided so as to cover, for instance, the first transistor 350A while exposing the second transistor 350B. The mask layer 309 may be formed on the basis of any appropriate deposition technique, such as PECVD wherein additionally, if required, a respective surface layer (not shown) or any other surface treatment may be performed in order to provide the desired adhesion for the resist material used for patterning the etch mask 310. Subsequently, the mask layer 309 may be patterned on the basis of the etch mask 310 in an anisotropic etch process 314, wherein the liner 304 may act as an efficient etch stop layer.

Figure 3B:
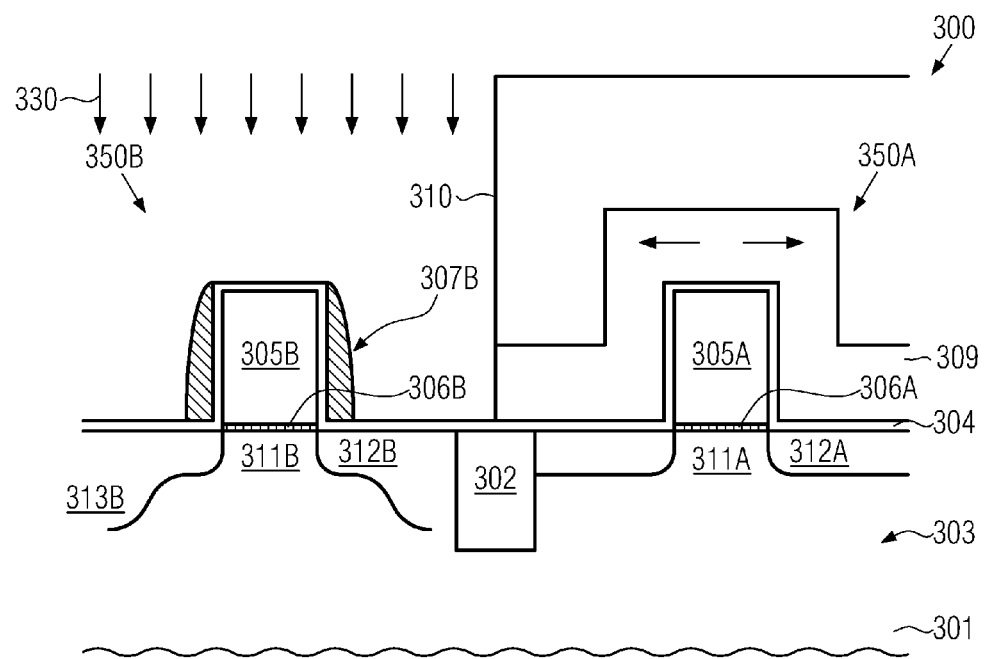

FIG. 3*b* schematically illustrates the device 300 after removing the exposed portion of the mask layer 309, wherein, in one illustrative embodiment, an additional implantation process 330 may be performed in order to significantly relax any stress in the corresponding spacer elements 307B formed from the mask layer 309. In other illustrative embodiments, the implantation process 330 may be designed so as to create respective deep drain and source regions 313B, while additionally a significant stress relaxation may be obtained in the spacer elements 307B.

Figure 3C:
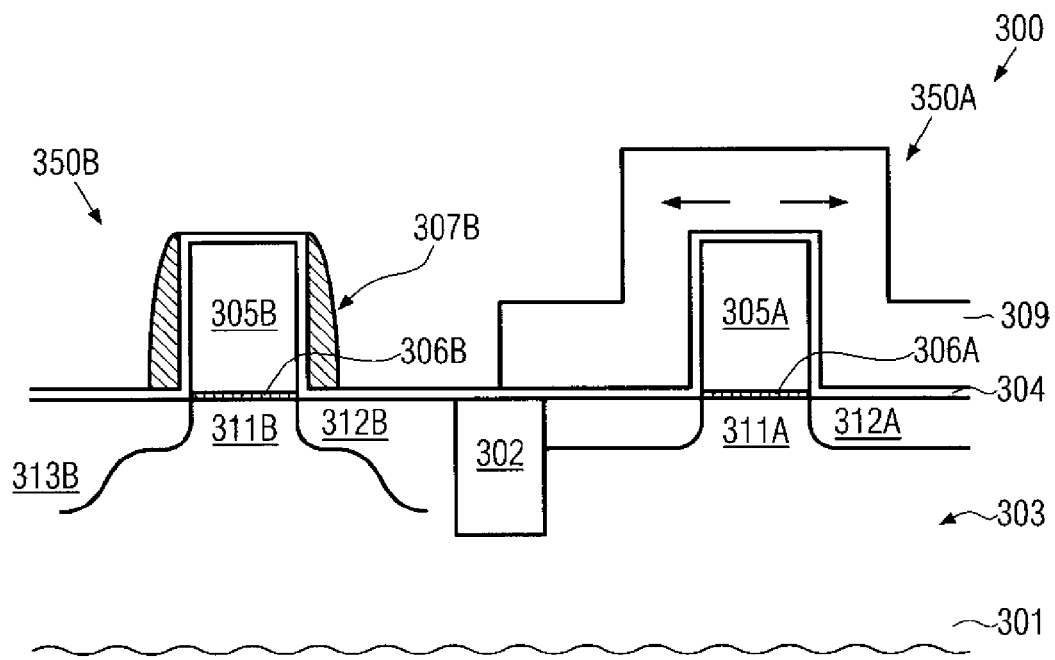

FIG. 3*c* schematically illustrates the semiconductor device 300 after the implantation process 330, wherein the respective drain and source regions 313B may be formed and the spacer elements 307B may be substantially relaxed. Furthermore, the etch mask 310 may be removed.

Figure 3D:
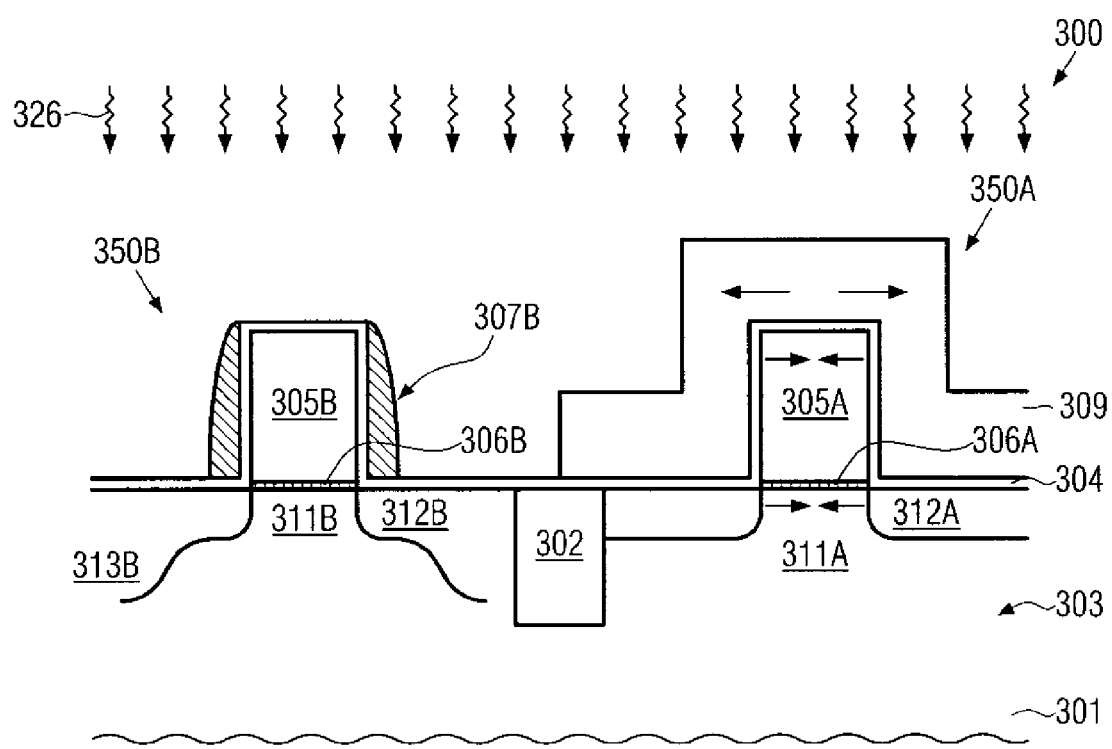

FIG. 3*d* schematically illustrates the semiconductor device 300 in accordance with some illustrative embodiments. Here, the device 300 is subjected to an anneal process 326 in order to efficiently transfer strain from the mask layer 309 into the portion of the semiconductor layer 303 within the first transistor 350A, thereby also creating a respective strain in the channel region 311A and the gate electrode 305A. Simultaneously, the respective dopant species in the second transistor 350B may be efficiently activated and any amorphized portions therein may be re-grown, wherein the substantially relaxed spacer elements 307B may not impart an unwanted stress during the re-growth process. In other illustrative embodiments, the anneal process 326 may be omitted when a respective strain-inducing mechanism in the first transistor 350A may not be desired. Next, the mask layer 309 may be removed along with the spacer element 307B in a common etch process. For instance, selective wet chemical etch recipes for removing silicon nitride selectively to silicon dioxide are well established in the art and may be used in this case. It should be appreciated, however, that other strategies may be applied, for instance by providing a silicon nitride material as the liner 304 and by forming the mask layer 309 on the basis of silicon dioxide material.

Figure 3E:
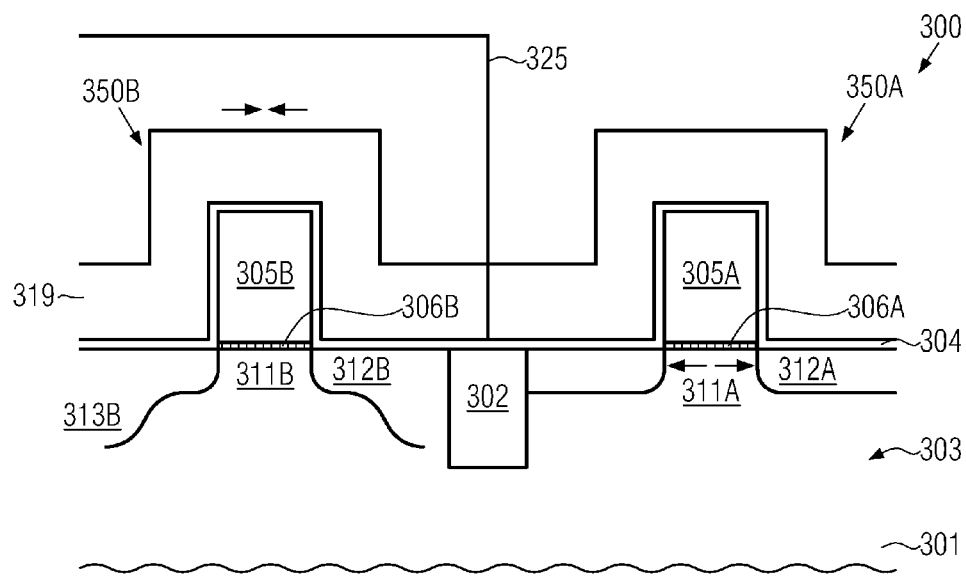

FIG. 3*e* schematically illustrates the semiconductor device 300 in a further advanced manufacturing stage, wherein a second mask layer 319 is formed above the first and second transistors 350A, 350B wherein the mask layer 319 may comprise a high intrinsic stress as required for obtaining a respective strain in the second transistor 350B. Furthermore, an etch mask 325, for instance comprised of a resist material, may be formed to cover the second transistor 350B while exposing the first transistor 350A. With respect to the mask layer 319 and the etch mask 325, the same criteria apply as previously explained with reference to previous mask layers and respective etch masks. It should be appreciated, however, that the mask layer 319 may not only differ in its intrinsic stress from the mask layer 309 but may also differ, in some embodiments, in layer thickness and/or material composition and the like, thereby providing a high degree of flexibility in forming respective spacer elements for the first transistor 350A. Similarly, the mask layer 309 (FIG. 3*a*) may have been formed so as to be appropriate for the spacer elements 307B, wherein, in some illustrative embodiments, a desired degree of stress may also be provided. For instance, if a different lateral profiling of the respective drain and source regions in the first and second transistors 350A, 350B may be advantageous, a corresponding difference in the mask layers 309, 319 may be provided, in addition or alternatively to any differences with respect to the corresponding intrinsic stress. Consequently, appropriate spacer elements may be formed on the basis of the etch mask 325 from the mask layer 319 and thereafter a respective implantation process may be carried out in order to form respective deep drain and source regions in the first transistor 350A.

Figure 3F:
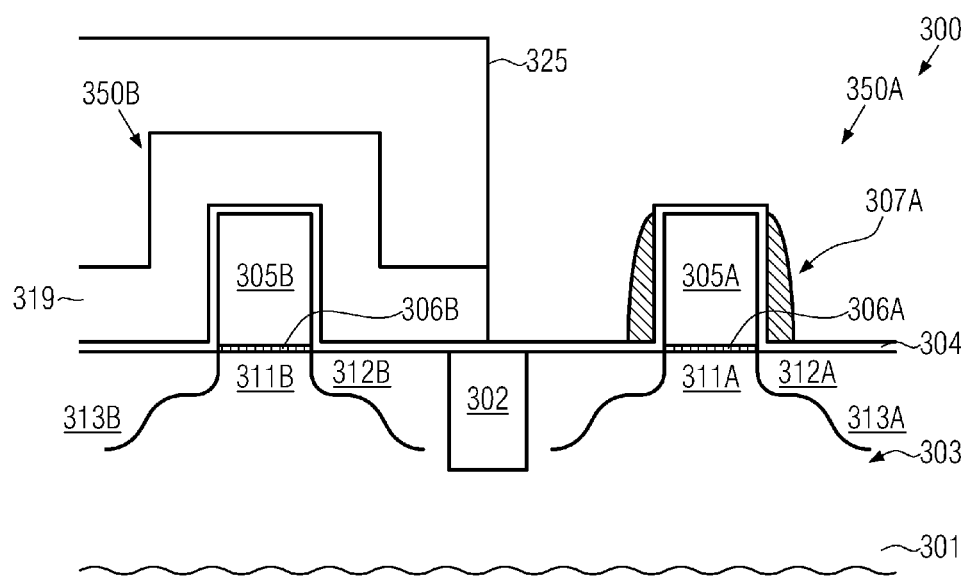

FIG. 3*f* schematically illustrates the semiconductor device 300 with respective spacer elements 307A and drain and source regions 313A, wherein the spacer elements 307A may be substantially relaxed due to the preceding heavy ion bombardment for forming the regions 313A. In other cases, a respective relaxation implantation may have been performed on the basis of an inert species, such as xenon and the like, wherein a further amorphization of the semiconductor layer 303 in the first transistor 350A may also be achieved if a corresponding re-crystallization may have been performed in a previous stage. It should be appreciated that, although the corresponding ion bombardment may possibly reduce to some extent the strain conserved in the gate electrode 305A, a significant amount of strain may be maintained in the channel region 311A. On the other hand, a high intrinsic stress is still present in the mask layer 319, wherein additionally a highly efficient stress transfer is obtained due to the close proximity of the stressed material with respect to the gate electrode 305B and the channel region 311B. In the illustrative embodiments described above, the preceding anneal process 326 (FIG. 3d) may have been performed so as to provide a certain amount of strain in the first transistor 350A. In this case, a subsequent amorphization process may be performed in order to provide for significant lattice damage in the second transistor 350B after the anneal process 326. In this case, the drain and source regions 313A are still in a substantially amorphous state, which may then be efficiently re-crystallized on the basis of an appropriate anneal process, thereby inducing a required high strain in the first transistor 350A, as is previously explained. Thereafter, the mask layer 319 and the spacers 307A may be removed in a common etch process, which may provide significant advantages when providing further stressed overlayers, such as stressed contact etch stop layers and the like.

Consequently, the manufacturing sequence as described with reference to FIGS. 3a-3f may provide enhanced flexibility in individually designing respective spacer elements, wherein a highly efficient strain-inducing mechanism may be obtained due to the reduced offset of the strained mask layer during the re-crystallization process. It should be noted that the above process sequence may not necessarily be performed for both transistors, as described above. For instance, the drain and source regions of one of the transistors may be formed on the basis of sidewall spacers obtained in accordance with conventional spacer techniques. Thereafter, the conventional sidewall spacers may be removed in a common process and a respective mask layer, such as the mask layer 309 or 319, may be formed and patterned so as to obtain specifically designed spacer elements in one of the transistors to form the respective deep drain and source regions, while nevertheless a highly efficiently strained growth of the substantially amorphized drain and source regions may be accomplished, as is previously explained. Hence, also in this case, a high degree of flexibility in individually adjusting the spacer width in combination with an enhanced strain-inducing mechanism may be achieved. Thus, irrespective of the process sequence used, the above-described advantages may be achieved without requiring an additional photolithography process compared to conventional strategies, in which a stress memorization technique is not used.

As a result, the subject matter disclosed herein provides highly efficient stress memorization techniques which may be advantageously combined with additional strain-inducing sources, wherein a stress memorization sequence may not require any additional lithography steps. Hence, a significant performance gain may be achieved while substantially not contributing to increased production costs. This may be achieved by using an implantation mask, at least a portion of which comprises a significant amount of intrinsic stress during the formation of extension regions and/or deep drain and source regions, wherein, in some illustrative embodiments, an increased flexibility in forming respective spacer elements may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first implantation mask comprising a specified first intrinsic stress above a semiconductor device, said first implantation mask covering a first region comprising a first gate electrode formed in a semiconductor layer of said semiconductor device and exposing a second region comprising a second gate electrode formed in said semiconductor layer of said semiconductor device;
    implanting a dopant species of a second conductivity type into said exposed second region adjacent to said second gate electrode while said first region is covered by said first implantation mask;
    annealing said first and second regions with said first implantation mask in place;
    forming a second implantation mask comprising a specified second intrinsic stress, said second implantation mask covering said second region and exposing said first region;
    introducing dopant species of first conductivity type into said exposed first region adjacent to said first gate electrode; and
    annealing said first region in the presence of at least a stressed portion of said second implantation mask.

2. The method of claim 1, further comprising forming a stressed material layer and patterning said stressed material layer on the basis of a resist mask to form said first implantation mask.

3. The method of claim 2, wherein said resist mask is maintained when implanting said dopant species of the second conductivity type.

4. The method of claim 1, further comprising removing said first implantation mask prior to forming said second implantation mask.

5. The method of claim 1, wherein said first intrinsic stress is a tensile stress and said first conductivity type is an N-type.

6. The method of claim 1, wherein said second intrinsic stress is a compressive stress and said second conductivity type is a P-type.

7. The method of claim 1, wherein said second implantation mask is formed prior to implanting said dopant species of the first conductivity type into said first region.

8. The method of claim 7, further comprising forming offset spacers at sidewalls of said first and second gate electrodes, forming a resist implantation mask so as to expose said second region, implanting said dopant species of the second conductivity type into said second region to form a source/drain extension implant region in the second region.

9. The method of claim 8, wherein said offset spacers are provided as a liner of specified thickness, said method further comprising using said liner as an etch stop layer when forming said second implantation mask.

10. The method of claim 2, further comprising increasing a surface adhesion for a resist material of said stressed material layer and depositing a resist layer above said stressed material layer having the increased surface adhesion.

11. A method, comprising:
forming a first gate electrode in a first region and a second gate electrode in a second region of a semiconductor layer formed above a semiconductor substrate;
forming a stressed material layer comprising a first intrinsic stress above said first and second regions of said semiconductor layer;
patterning said stressed material layer to form a first implantation mask, said first implantation mask covering said first region and exposing said second region of said semiconductor layer;
implanting a dopant species of a second conductivity type into said exposed second region of said semiconductor layer adjacent to said second gate electrode while said first region is covered by said first implantation mask;
performing an annealing process to anneal said first and second regions of said semiconductor layer;
forming a second implantation mask comprising a second intrinsic stress, said second implantation mask covering said second region and exposing said first region of said semiconductor layer;
implanting a dopant species of a first conductivity type into said exposed first region of said semiconductor layer adjacent to said first gate electrode; and
performing an annealing process on said first region in the presence of at least a stressed portion of said second implantation mask.

12. The method of claim 11, wherein said first intrinsic stress is a tensile stress and said second intrinsic stress is a compressive stress, and wherein said first conductivity type is an N-type and said second conductivity type is a P-type.

13. The method of claim 11, further comprising forming offset spacers at sidewalls of said first and second gate electrodes, said offset spacers comprising a liner.

14. The method of claim 13, wherein patterning said stressed material layer to form said first implantation mask comprises
forming a resist implantation mask above said first region; and
performing an etch process to remove said stressed material layer from above said second region using said resist implantation mask as an etch mask and said liner as an etch stop layer.

* * * * *